United States Patent
Kim et al.

(10) Patent No.: US 8,058,676 B2
(45) Date of Patent: Nov. 15, 2011

(54) SPIN TRANSISTOR USING DOUBLE CARRIER SUPPLY LAYER STRUCTURE

(75) Inventors: Hyung Jun Kim, Seoul (KR); Hyun Cheol Koo, Seoul (KR); Joon Yeon Chang, Seoul (KR); Suk Hee Han, Seoul (KR); Kyung Ho Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 334 days.

(21) Appl. No.: 12/342,426

(22) Filed: Dec. 23, 2008

(65) Prior Publication Data

US 2010/0084633 A1    Apr. 8, 2010

(30) Foreign Application Priority Data

Oct. 2, 2008  (KR) .................. 10-2008-0096896

(51) Int. Cl.
*H01L 29/76*  (2006.01)
(52) U.S. Cl. ................. 257/295; 257/E43.003
(58) Field of Classification Search .......... 257/295, 257/29.164, 43.003, E43.003; 365/158; 295/295, 295/29.164, E43.003
See application file for complete search history.

(56) References Cited

U.S. PATENT DOCUMENTS 5,767,539 A * 6/1998 Onda .................. 257/194
2007/0059877 A1 * 3/2007 Koo et al. ............ 438/213

OTHER PUBLICATIONS

Supriyo Datta and Biswajit Das, "Electronic analog of the electro-optic modulator", Feb. 12, 1990, 3 Pages.

* cited by examiner

*Primary Examiner* — Thomas L Dickey
(74) *Attorney, Agent, or Firm* — Renner, Otto, Boisselle & Sklar, LLP (57) ABSTRACT

A spin transistor includes a semiconductor substrate including a channel layer having a 2-dimensional electron gas structure and upper and lower cladding layers disposed respectively in upper and lower sides of the channel layer; ferromagnetic source and drain electrodes formed on the semiconductor substrate and disposed spaced apart from each other; a gate electrode disposed between the source electrode and the drain electrode and having a gate voltage applied thereto in order to control the spin of electrons passed through the channel layer; a first carrier supply layer disposed between the lower cladding layer and the channel layer to supply carriers to the channel layer; and a second carrier supply layer disposed between the upper cladding layer and the channel layer to supply carriers to the channel layer.

10 Claims, 7 Drawing Sheets

SPIN TRANSISTOR USING DOUBLE CARRIER SUPPLY LAYER STRUCTURE

CROSS-REFERENCE TO RELATED APPLICATIONS

This application claims the priority of Korean Patent Application No. 2008-96896 filed on Oct. 2, 2008, in the Korean Intellectual Property Office, the disclosure of which is incorporated herein by reference.

BACKGROUND OF THE INVENTION

1. Field of the Invention

The present invention relates to a spin transistor including a ferromagnetic source/drain and a semiconductor channel, and more particularly, to a spin transistor capable of changing a potential gradient of a channel into positive and negative values according to applied gate voltage and adjusting a spin-orbit coupling constant to a wide extent according to the applied gate voltage.

2. Description of the Related Art

As one of novel devices to overcome physical limits of conventional electronic devices, there have been ardent attempts to develop a spin transistor (or, Spin-FET). In 1990s, Datta and Das propose a spin transistor using a two-dimensional electron gas (2DEG) as a channel (see Applied physics letter, vol. 56, 665, 1990). Since then, there have been attempts to control the spin of spin-injected electrons, as well as to transfer spin-polarized electrons in a hybrid structure where a ferromagnetic and a semiconductor are incorporated to each other.

In order to perform a basic operation of a spin transistor using electron spin precession, spin-polarized electrons should be essentially injected from the ferromagnetic into semiconductor, and a gate electrode should be ultimately used to control the spin precession of the spin-polarized electrons injected into the 2-dimensional electron gas channel. In this case, a spin-orbit interaction in the 2-dimensional electron gas channel should be high in order to effectively control the spin precession, and a suitable electric resistance between the ferromagnetic and the semiconductor should be maintained to observe a spin injection signal in an electrical manner. The intensity of the spin-orbit interaction may be quantified by employing a spin-orbit coupling constant ($\alpha$) that may be obtained by an SdH (Shubnikov de Haas) oscillation experiments. Up to date, it has been reported that a channel structure based on the InAs two-dimensional electron gas is composed of materials that best satisfy the above-mentioned requirements.

Silicon-based semiconductor technology has occupied the most important position in modern industries, and been designed and manufactured on the basis of MOSFET (Metal Semiconductor Field Effect Transistor). This conventional semiconductor-based transistor uses an electric field to control electric charges in the semiconductor. On the contrary, the spin transistor functions to control the electric charges and spin at the same time, and therefore may be used in switching elements, logic circuits and so on under the control of spin-polarized electrons. When there is an electric field (E) that is vertical to a wave vector (k) of electrons moving in the two-dimensional electron gas channel, a magnetic field is formed due to the spin-orbit interaction, as shown in the following equation: $H_{Rashba} \propto k \times E$. This is called a Rashba effect where a magnetic field induced by the spin-orbit interaction is formed in the y-axis direction when an electric current moves towards the x-axis direction and an electric field is applied towards the z-axis direction by means of the gate voltage. The spin-polarized electrons injected into the channel of the spin transistor may cause a spin precession through the magnetic field, and use the gate voltage to adjust a precession angle.

In order to supply an electric charge to the two-dimensional electron gas channel through which the source and drain electrodes of the spin transistor are connected to each other, a carrier supply layer may be formed in a lower side of the channel. In the case of the configuration of the conventional spin transistor where the carrier supply layer is formed in the lower side of the channel, however, an energy band structure and an electron distribution of the channel are highly asymmetric with being acutely inclined in one direction, and have a negative potential gradient. This potential gradient of the channel is changed into only a negative value within a limited range, regardless of the application of a gate voltage (or, the changes in applied voltage). This indicates that there are limits in embodying a spin transistor to improve the spin-orbit interaction.

SUMMARY OF THE INVENTION

The present invention is designed to solve the problems of the prior art, and therefore it is an object of the present invention to provide a spin transistor capable of adjusting a potential gradient of a channel to positive and negative values according to applied gate voltage and changing a spin-orbit coupling constant to a wide extent according to the applied gate voltage.

Also, it is another object of the present invention to provide a spin transistor capable of effectively adjusting the changes in spin-orbit coupling constant to a desired extent.

According to an aspect of the present invention, there is provided a spin transistor including a semiconductor substrate including a channel layer having a 2-dimensional electron gas structure and upper and lower cladding layers disposed respectively in upper and lower sides of the channel layer; ferromagnetic source and drain electrodes formed on the semiconductor substrate and disposed spaced apart from each other in a longitudinal direction of the channel layer; a gate electrode disposed between the source electrode and the drain electrode, formed on the semiconductor substrate and having a gate voltage applied thereto in order to control the spin of electrons passed through the channel layer; a first carrier supply layer disposed between the lower cladding layer and the channel layer to supply carriers to the channel layer; and a second carrier supply layer disposed between the upper cladding layer and the channel layer to supply carriers to the channel layer.

In this case, the channel layer may optionally adjust a potential gradient of the channel layer to positive and negative values according to the changes in the applied gate voltage.

Also, the channel layer may be formed with a double channel structure of a first channel layer and 2 second channel layers, wherein the first channel layer has a first band gap, and the 2 second channel layers have a higher second band gap than the first band gap and are disposed in upper and lower sides of the first channel layer so that the first channel layer is sandwiched therebetween. Also, the channel layer may be formed with a single channel structure of single quantum well.

Additionally, the first carrier supply layer and the second carrier supply layer may have different doping concentrations, and both an energy band structure and an electron distribution in the channel layer may be asymmetric.

Also, the first carrier supply layer and the second carrier supply layer may have different thicknesses, and both an energy band structure and an electron distribution in the channel layer may be asymmetric.

In addition, the upper cladding layer and the lower cladding layer may have different thicknesses, and both an energy band structure and an electron distribution in the channel layer may be asymmetric.

Additionally, when the channel layer is formed with the above-mentioned double channel structure, the potential gradient may be suitably adjusted without the use of a gate voltage by asymmetrically disposing the first channel layer with respect to the second channel layer in the whole channel layers, the first channel layer having a relatively lower band gap.

Furthermore, the channel layer may be formed of semiconductor material selected from the group consisting of gallium arsenide (GaAs), indium arsenide (InAs), indium gallium arsenide (InGaAs) and indium antimonide (InSb). In particular, when the channel layer is formed with the above-mentioned double channel structure, the first channel layer may be formed of InAs, and the second channel layers may be formed of InGaAs. Also, the upper/lower cladding layer may be formed of indium aluminum arsenide (InAlAs). When the channel layer is formed with the single channel structure of single quantum well, the channel layer may be formed of InGaAs.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Hereinafter, exemplary embodiments of the present invention will now be described in detail with reference to the accompanying drawings. However, it is considered that modifications and variations may be made without departing from the scope of the invention.

Figure 1:
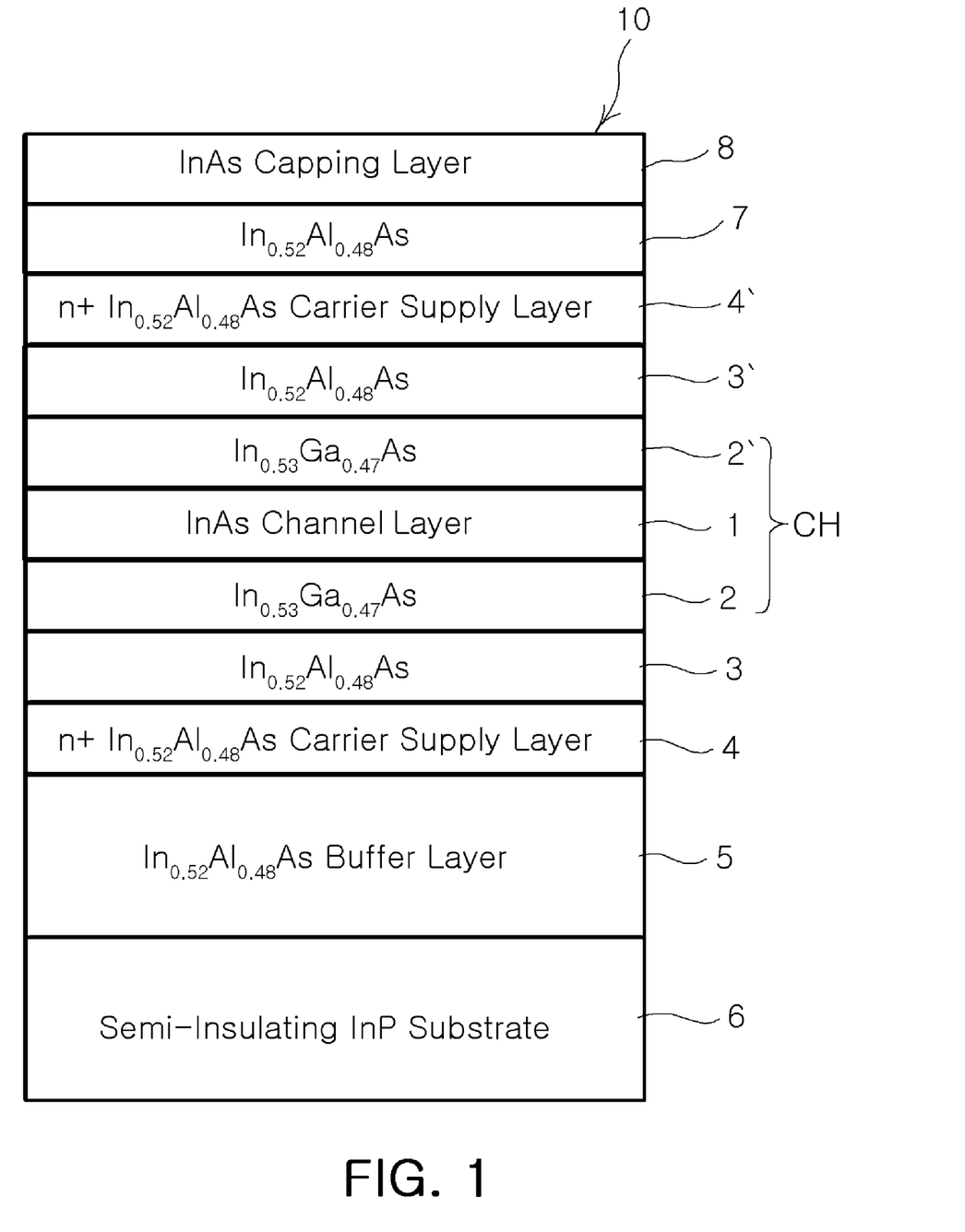
FIG. 1 is a diagram illustrating a cross section of a semiconductor substrate in a spin transistor according to one exemplary embodiment of the present invention.
Figure 2:
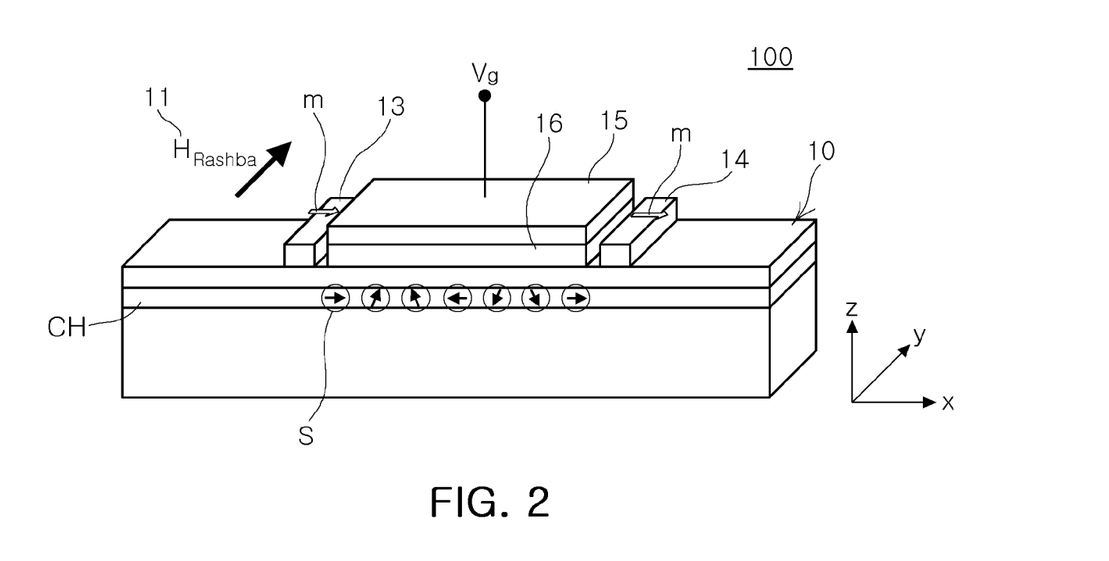
FIG. 2 is a perspective view illustrating a schematic configuration of the spin transistor according to one exemplary embodiment of the present invention.

FIG. 1 is a diagram illustrating a cross section of a semiconductor substrate in a spin transistor according to one exemplary embodiment of the present invention, and FIG. 2 is a perspective view illustrating a schematic configuration of the spin transistor according to one exemplary embodiment of the present invention. The spin transistor 100 as shown in FIG. 2 may use the semiconductor substrate 10 having the cross section as shown in FIG. 1.

Referring to FIG. 1, the semiconductor substrate 10 includes a semi-insulating InP substrate 6, and an InAlAs buffer layer 5, a first n+ InAlAs carrier supply layer 4, a lower InAlAs cladding layer 3, a lower InGaAs channel layer 2, an InAs channel layer 1, an upper InGaAs channel layer 2', an upper InAlAs cladding layer 3', and a second n+ InAlAs carrier supply layer 4', all of which are sequentially stacked onto the semi-insulating InP substrate 6. Here, an InAlAs layer 7 having the identical or similar composition to the buffer layer 5 is further formed on the second n+ InAlAs carrier supply layer 4', and an InAs capping layer 8 is formed on the InAlAs layer 7.

The lower and upper InGaAs channel layers 2 and 2' and the InAs channel layer 1 formed between the lower and upper InGaAs channel layers 2 and 2' have a double channel structure of 2-dimensional electron gas (2DEC), and therefore spin-polarized electrons are passed through these channels (CH) 1, 2 and 2' in the operation of the spin transistor. In this case, the InAs channel layer 1 has a lower energy band gap than those of the lower and upper InGaAs channel layers 2 and 2'. The whole channel layers 1, 2 and 2' are sandwiched between the undoped lower cladding layer 3 and the undoped upper cladding layer 3', both of which have a higher band gap than those of the whole channel layers. Here, electron carriers are defined within the whole channel layers 1, 2 and 2' by means of the cladding layers 3 and 3', thereby forming a 2-dimensional electron gas structure having high mobility. In accordance with one exemplary embodiment of the present invention, the above-mentioned channel (CH) structure is a double channel structure of InAs and InGaAs 1, 2 and 2', but the present invention is not particularly limited thereto. For example, a single channel structure of single quantum well where the InAs channel layer 1 is omitted from the channel (CH) as shown in FIG. 1 may be used for a channel of the spin transistor. In accordance with one exemplary embodiment of the present invention, InAs and InGaAs are used as the channel (CH), but the present invention is not particularly limited thereto. For example, when a composition of a cladding layer having a suitable band gap is selected, GaAs or InSb may be sued as the channel layer of the spin transistor.

The relatively thick buffer layer 5 is formed to relieve lattice mismatch between 2-dimensional electron gas structures of the semi-insulating InP substrate 6 and the first carrier supply layer 4 that is grown onto the buffer layer 5, and all the layers except for the InAs channel layer 1 may be formed to match their lattices to the InP substrate. The InAs capping layer 6 functions to prevent oxidation and degeneration of a semiconductor that may be generated when a semiconductor substrate is exposed to the air after its manufacture.

The n+ InAlAs carrier supply layers 4 and 4' supplying carriers to the 2-dimensional electron gas channels (CH) 1, 2 and 2' are formed both in lower and upper sides of the 2-dimensional electron gas channels (CH). An energy band structure (particularly, an energy band structure when a gate voltage is not applied) and an electron distribution of the channels (CH) may be made symmetric in up and down directions by disposing the carrier supply layers 4 and 4' in lower and upper sides of the channels (CH), respectively. Also, this double structure of the carrier supply layers 4 and 4' may enhance the up and down symmetry in energy bands of the channels (CH) even when the energy bands of the channels (CH) are not completely symmetric in up and down directions.

The enhancement of the symmetry in the energy bands of the channels (CH) by the double carrier supply layer structure makes it possible to control the change in a potential gradient in the 2-dimensional electron gas channels (CH) into negative and positive values more easily and adjust a spin-orbit coupling constant to a wider extent, as will be described later.

FIG. 2 is a schematic diagram illustrating a configuration of one of various spin transistors that may be used in the present invention. Referring to FIG. 2, the spin transistor 100 includes a semiconductor substrate 10 having a semiconductor channel (CH) and ferromagnetic source and drain electrodes 13 and 14 disposed spaced apart from each other in a direction of the semiconductor channel (CH). A gate electrode 15 is formed on the semiconductor substrate 10 and disposed between the source and drain electrodes 13 and 14. The gate electrode 15 is insulated from the semiconductor substrate 10 by a gate insulator 16 such as $SiO_2$ etc.

A basic operation of the spin transistor 100 may be, for example, described in detail, as follows. Spin electrons parallel with a magnetization direction (m: for example, an x-axis direction as shown in FIG. 2) of the ferromagnetic source electrode 13 are injected from the source electrode 13 into the semiconductor channel layer (CH), and moves through the semiconductor channel. In this case, since a magnetic field ($H_{Rashba}$) 11 induced by the spin-orbit interaction is parallel with the y axis, the spin electrons passed through the channel layer (CH) causes precession in the x-z plane. Arrows indicated in the channel layer (CH) sequentially represents a series of precession of spin-polarized electrons (S). Then, the spin electrons (S) reaches the drain electrode 14 in the +x-axis or −x-axis spin by adjusting a precession level of the electrons injected into the channel (CH) by using the gate voltage (Vg), thus to control an "ON" or "OFF" state of the spin transistor 100. In this case, the use of the double carrier supply layer structure of the carrier supply layers 4 and 4' disposed in the upper and lower sides of the channel (CH) (see FIG. 1) makes it possible to control the precession of the electrons in the channel (CH) and control the ON/OFF state of the spin transistor 100 by means of the precession of the electrons more easily and effectively.

More particularly, the control of the potential gradient in the channel (CH) by the use of the above-mentioned double carrier supply layer structure is more easily achieved to a wider range (from a negative potential gradient to a positive potential gradient), and therefore it is possible to increase the changes in the spin-orbit coupling constant according to the applied gate voltage. This eventually makes it possible to improve the spin-orbit interaction, obtain the optimum channel length between the source and drain electrodes, and effectively control the spin precession caused by the gate electrode and required for embodying the spin transistor.

Figure 3A:
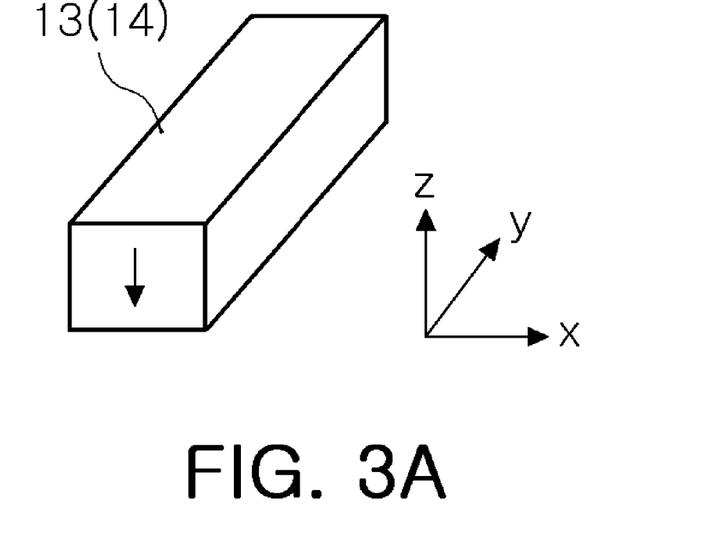
FIGS. 3A and 3B are perspective views illustrating possible configurations of ferromagnetic source and drain electrodes in the spin transistor according to one exemplary embodiment of the present invention.
Figure 3B:
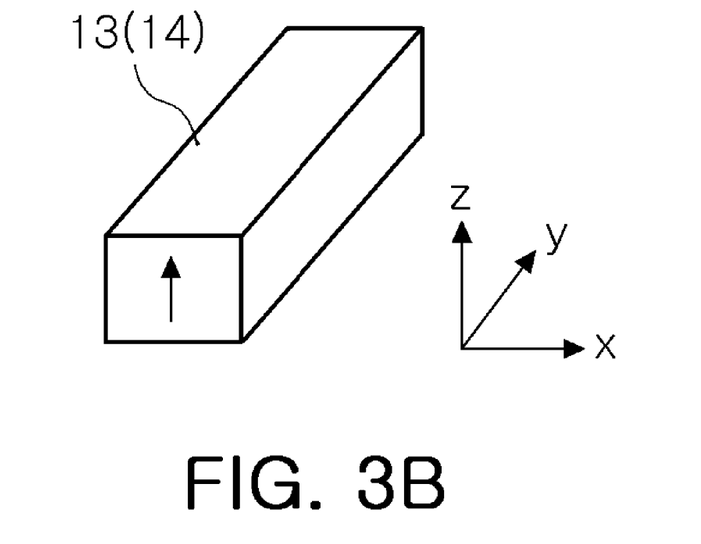

As shown in FIG. 2, the magnetization direction (m) of the ferromagnetic source and drain electrodes 13 and 14 is parallel with the longitudinal direction (x-axis direction) of the channel (CH), but the present invention is not particularly limited thereto. For example, the magnetization direction may be parallel with the −z-axis or +z-axis direction that is vertical to the channel layer (see arrows), as shown in FIG. 3A or 3B. In this case, the spin electrons in the channel (CH) may also cause the precession in the x-z plane by means of the spin-orbit interaction. The perpendicular magnetization of the ferromagnetics may be achieved, for example, using shape anisotropy or crystalline anisotropy, or using a laminate.

Figure 4:
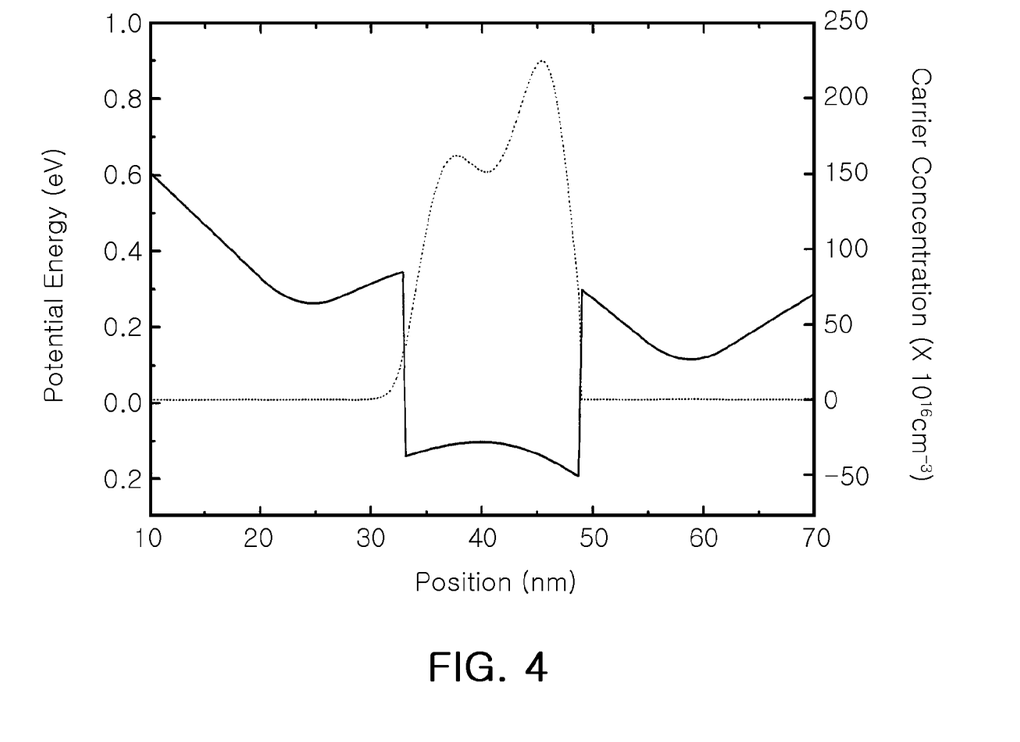
FIG. 4 is a graph illustrating an energy band structure (solid line) and an electron distribution (dotted line) of a single quantum well channel layer and its surroundings in the spin transistor according to one exemplary embodiment of the present invention.

FIG. 4 is a graph illustrating an energy band structure (solid line) and an electron distribution (dotted line) of a semiconductor substrate having a single channel structure of single quantum well where the InAs channel layer 1 is omitted from the structure of the semiconductor substrate 10 shown in FIG. 1. In the double channel structure (double quantum well) using the InAs 1 and the InGaAs 2 and 2', the InGaAs 2 and 2' function as a channel (CH), as shown in FIG. 4, even when the InGaAs 2 and 2' have a relatively lower electron mobility than the InAs channel layer 1. When only one carrier supply layer is formed in an upper or lower side of the channel in the semiconductor substrate including the single quantum well channel (CH), the electron distribution in the InGaAs channel layer are biased towards the carrier supply layer, and the energy band in the channel layer has either a positive or negative gradient. On the contrary, when the carrier supply layers 4 and 4' having the same composition and thickness are present in the upper and lower sides of the InGaAs channel layer having a thickness of approximately 16 nm, a relatively highly symmetric state of the energy band structure and the electron distribution is shown in the channel layer, as shown in FIG. 4. The energy band structure (solid line) of FIG. 4 represents a potential energy when a gate voltage is not applied.

Figure 5:
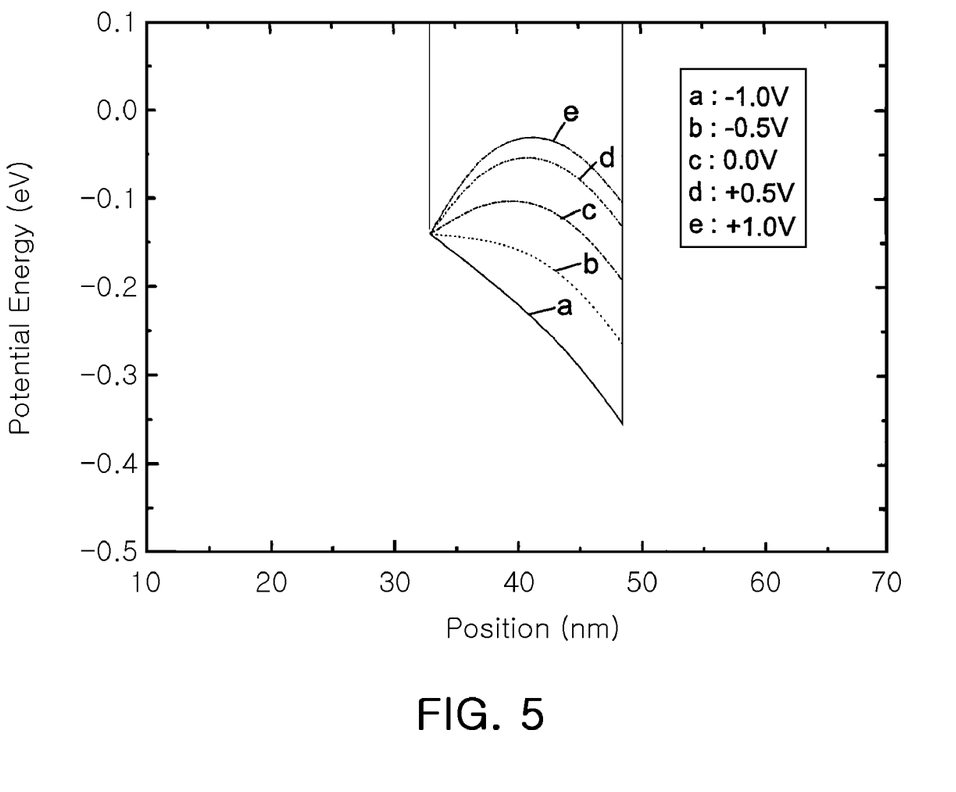
FIG. 5 is a graph illustrating the changes in potential gradient of electrons distributed in the channel layer according to the applied gate voltage in the case of the spin transistor as shown in FIG. 4.

FIG. 5 is a graph illustrating the changes in potential gradient of electrons distributed in the channels (CH) 2 and 2' (having a single quantum well structure) according to the applied gate voltage in the case of the spin transistor (having an InGaAs channel structure of single quantum well) as shown in FIG. 4. In FIG. 5, reference symbols a, b, c, d and e represent the changes in potential energies (eV) in the InGaAs channel layer with a single quantum well structure according to the position (nm) in a longitudinal direction when gate voltages of −1, −0.5, 0, 0.5 and 1 V are applied respectively to the InGaAs channel layer. As shown in FIG. 5, the potential gradient of the InGaAs channel is changed from a negative value to a positive value as the applied gate voltage is changed from a positive value to a negative value. This is in a contrast to the context that the potential gradient in the channel is changed into either a positive or negative value according to the changes in the applied gate voltage in the case of the single carrier supply layer structure. Eventually, the potential gradient in the channel may be more easily and effectively controlled to a wider extent (including negative and positive values) according to the applied gate voltage, and therefore the spin-orbit coupling constant is increased to facilitate the control of the electron spin in the channel according to the applied gate voltage.

Figure 6:
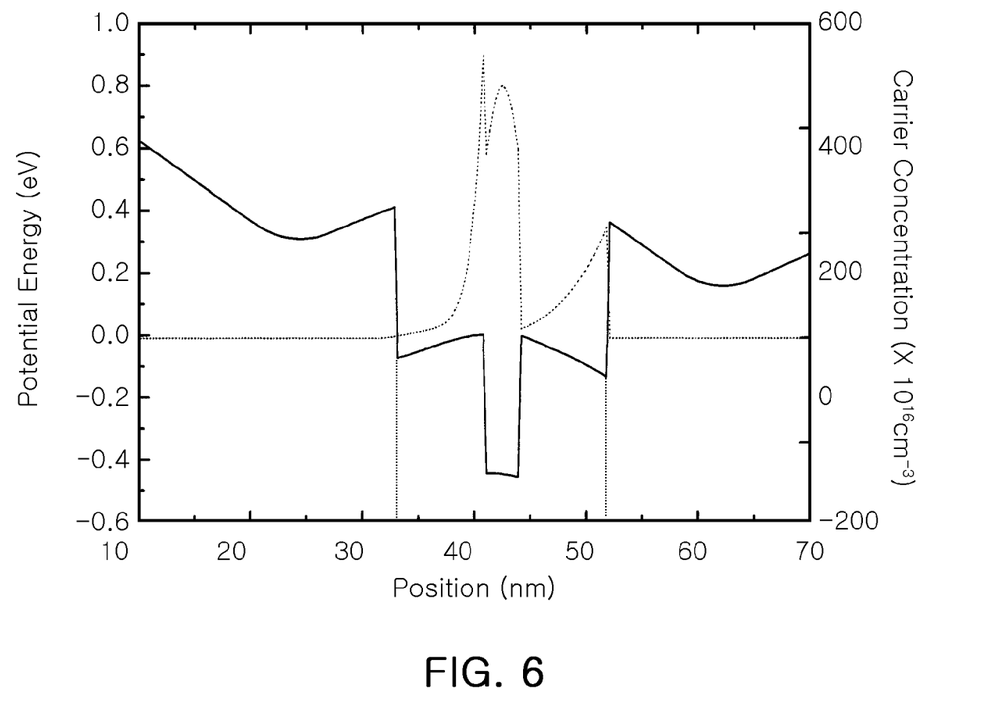
FIG. 6 is a graph illustrating an energy band structure (solid line) and an electron distribution (dotted line) of a double quantum well channel layer and its surroundings in the spin transistor according to another exemplary embodiment of the present invention.

FIG. 6 is a graph illustrating an energy band structure (solid line) and an electron distribution (dotted line) of a double quantum well channel layer and its surroundings in the spin transistor including the semiconductor substrate 10 as shown in FIG. 1. Referring to the graph as shown in FIG. 6, an energy well having the narrowest width corresponds to the InAs channel layer 1 of FIG. 1, and energy wells having a higher side width correspond respectively to the InGaAs channels 2 and 2'. As shown in FIG. 6, the energy band structure of the double channel layer shows its significantly high symmetry, and the electrons are intensively distributed in the InAs channel layer 1 that is inserted in the center of the double channel structure and has a narrow width. Most (a significant amount) of electric current in the double channel structure flows through the InAs channel layer 1.

Figure 7:
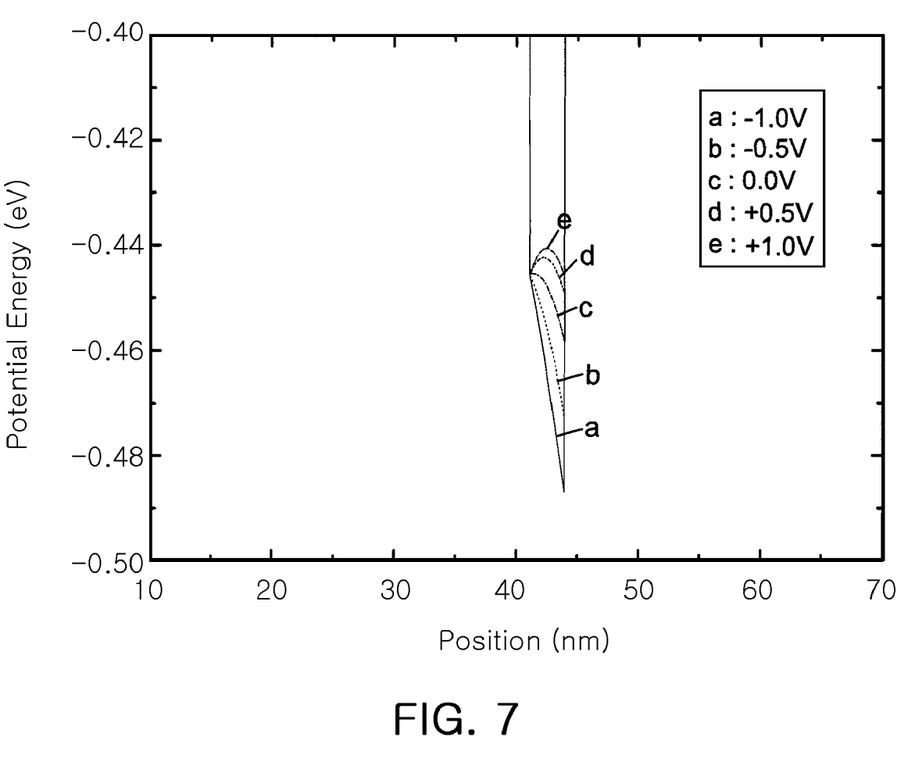
FIG. 7 is a graph illustrating the changes in potential gradient of electrons distributed in the centrally inserted channel layer according to the applied gate voltage in the case of the spin transistor as shown in FIG. 6.

FIG. 7 is a graph illustrating the changes in potential gradient of electrons distributed in the centrally inserted InAs channel layer 1 according to the applied gate voltage in the case of the spin transistor (having a double channel structure of double quantum well) as shown in FIG. 6. The centrally inserted InAs channel layer 1 may be asymmetrically disposed in the whole channel layers (the InAs channel layer and the InGaAs channel layers disposed in upper and lower sides of the InAs channel layer, see FIG. 1). In FIG. 7, reference symbols a, b, c, d and e represent the changes in potential energies (eV) in the InAs channel layer according to the position (nm) in a longitudinal direction when gate voltages of −1, −0.5, 0, 0.5 and 1 V are applied respectively to the InAs channel layer. As shown in FIG. 7, the potential gradient of the InAs channel is changed from a negative value to a positive value as the applied gate voltage is changed from a positive value to a negative value. As a result, the potential gradient in the channel may be more easily and effectively controlled to a wider extent (including negative and positive values) according to the applied gate voltage, and therefore the spin-orbit coupling constant is increased to facilitate the control of the electron spin in the channel according to the applied gate voltage.

In order to adjust the potential gradient in the channel to a desired extent (thus to adjust a spin-orbit coupling constant into a desired extent), the InAs channel layer may be intentionally asymmetrically disposed in the overall double channel structure. For example, the InAs channel layer 1 may be asymmetrically disposed in the overall double channel structure so that the lower InGaAs channel layer 2 can be formed at a higher thickness than the upper InGaAs channel layer 2', and be asymmetrically disposed in a reverse manner.

Furthermore, the energy band structure and the electron distribution in the channel may be made asymmetric by adjusting the concentrations of the lower first carrier supply layer 4 and the upper second carrier supply layer 4' to different concentration ranges and adjusting the thickness of the two lower and upper carrier supply layers 4 and 4' to different thickness ranges. Also, the energy band structure and the electron distribution in the channel may be made asymmetric by adjusting the thickness of the lower and upper cladding layers 3 and 3' to different thickness ranges. The potential gradient and the spin-orbit coupling constant in the whole channels may be adjusted to desired extents under the control of the difference in the relative concentration and thickness of the double carrier supply layer, or the control of the difference in the thickness of the upper/lower cladding layers.

In accordance with the exemplary embodiments of the present invention, the spin transistor may be used to highly improve the spin-orbit interaction of a channel that is one of the major components that are used to embody the spin transistor. Accordingly, the spin transistor according to one exemplary embodiment of the present invention may be useful to improve the up and down symmetry in the energy band structure and the electron distribution in the channel by disposing the two carrier supply layers in upper and lower sides of the channel layer having a 2-dimensional electron gas structure, and thus to easily changes the potential gradient of the channel into positive and negative values, depending on the applied gate voltage. Also, the spin transistor according to one exemplary embodiment of the present invention may be useful to effectively adjust the spin-orbit coupling constant to a desired constant extent by adjusting the doping concentration or thickness of the two carrier supply layers, which are disposed in the upper and lower sides of the channel layer, to a different doping concentration or thickness range, or asymmetrically disposing the center of the whole channel layers having a double channel structure.

While the present invention has been shown and described in connection with the exemplary embodiments, it will be apparent to those skilled in the art that modifications and variations can be made without departing from the spirit and scope of the invention as defined by the appended claims.

What is claimed is:

1. A spin transistor, comprising:
    a semiconductor substrate including a channel layer having a 2-dimensional electron gas structure and upper and lower cladding layers disposed respectively at upper and lower sides of the channel layer;
    ferromagnetic source and drain electrodes formed on the semiconductor substrate and disposed spaced apart from each other in a longitudinal direction of the channel layer;
    a gate electrode disposed between the source electrode and the drain electrode, formed on the semiconductor substrate such that a gate voltage applied thereto controls the spin of electrons passed through the channel layer;
    a first electrical charge supply layer disposed at a lower side of the lower cladding layer to supply carriers to the channel layer; and
    a second electrical charge supply layer disposed at an upper side of the upper cladding layer to supply carriers to the channel layer;
    wherein the channel layer is formed with a double channel structure of a first channel layer and two second channel layers, wherein the first channel layer has a first band gap, and the two second channel layers have a higher second band gap than the first band gap and are disposed at upper and lower sides of the first channel layer so that the first channel layer is sandwiched therebetween; and
    wherein the first channel layer is asymmetrically disposed in the channel layer.

2. The spin transistor of claim 1, wherein the channel layer optionally adjusts a potential gradient of the channel layer to positive and negative values according to the changes in the applied gate voltage.

3. The spin transistor of claim 1, wherein the first channel layer is formed of indium arsenide (InAs), and the second channel layer is formed of indium gallium arsenide (InGaAs).

4. The spin transistor of claim 3, wherein the upper/lower cladding layers are formed of indium aluminum arsenide (InAlAs).

5. The spin transistor of claim 1, wherein the channel layer is formed with a single channel structure of single quantum well.

6. The spin transistor of claim 5, wherein the channel layer is formed of InGaAs.

7. The spin transistor of claim 1, wherein the channel layer is formed of a semiconductor material selected from the group consisting of gallium arsenide (GaAs), InAs, InGaAs and indium antimonide (InSb).

8. A spin transistor, comprising:
    a semiconductor substrate including a channel layer having a 2-dimensional electron gas structure and upper and lower cladding layers disposed respectively at upper and lower sides of the channel layer;
    ferromagnetic source and drain electrodes formed on the semiconductor substrate and disposed spaced apart from each other in a longitudinal direction of the channel layer;
    a gate electrode disposed between the source electrode and the drain electrode, formed on the semiconductor substrate such that a gate voltage applied thereto controls the spin of electrons passed through the channel layer;

a first electrical charge supply layer disposed at a lower side of the lower cladding layer to supply carriers to the channel layer; and a second electrical charge supply layer disposed at an upper side of the upper cladding layer to supply carriers to the channel layer, wherein the first electrical charge supply layer and the second electrical charge supply layer have different doping concentrations, and both an energy band structure and an electron distribution in the channel layer are asymmetric.

9. A spin transistor, comprising:

a semiconductor substrate including a channel layer having a 2-dimensional electron gas structure and upper and lower cladding layers disposed respectively at upper and lower sides of the channel layer;

ferromagnetic source and drain electrodes formed on the semiconductor substrate and disposed spaced apart from each other in a longitudinal direction of the channel layer;

a gate electrode disposed between the source electrode and the drain electrode, formed on the semiconductor substrate such that a gate voltage applied thereto controls the spin of electrons passed through the channel layer;

a first electrical charge supply layer disposed at a lower side of the lower cladding layer to supply carriers to the channel layer; and a second electrical charge supply layer disposed at an upper side of the upper cladding layer to supply carriers to the channel layer, wherein the first electrical charge supply layer and the second electrical charge supply layer have different thicknesses, and both an energy band structure and an electron distribution in the channel layer are asymmetric.

10. A spin transistor, comprising:

a semiconductor substrate including a channel layer having a 2-dimensional electron gas structure and upper and lower cladding layers disposed respectively at upper and lower sides of the channel layer;

ferromagnetic source and drain electrodes formed on the semiconductor substrate and disposed spaced apart from each other in a longitudinal direction of the channel layer;

a gate electrode disposed between the source electrode and the drain electrode, formed on the semiconductor substrate such that a gate voltage applied thereto controls the spin of electrons passed through the channel layer;

a first electrical charge supply layer disposed at a lower side of the lower cladding layer to supply carriers to the channel layer; and a second electrical charge supply layer disposed at an upper side of the upper cladding layer to supply carriers to the channel layer, wherein the upper cladding layer and the lower cladding layer have different thicknesses, and both an energy band structure and an electron distribution in the channel layer are asymmetric.

* * * * *